(12) United States Patent
Liu et al.

(10) Patent No.: US 10,726,230 B2
(45) Date of Patent: Jul. 28, 2020

(54) DISPLAY PANEL, DRIVING METHOD THEREFOR, AND DISPLAY DEVICE

(71) Applicant: BOE TECHNOLOGY GROUP CO., LTD., Beijing (CN)

(72) Inventors: Yingming Liu, Beijing (CN); Xue Dong, Beijing (CN); Haisheng Wang, Beijing (CN); Xiaoliang Ding, Beijing (CN); Rui Xu, Beijing (CN); Lijun Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 234 days.

(21) Appl. No.: 15/767,358

(22) PCT Filed: Sep. 30, 2017

(86) PCT No.: PCT/CN2017/104729
§ 371 (c)(1),
(2) Date: Apr. 11, 2018

(87) PCT Pub. No.: WO2018/157596
PCT Pub. Date: Sep. 7, 2018

(65) Prior Publication Data
US 2019/0057236 A1 Feb. 21, 2019

(30) Foreign Application Priority Data
Feb. 28, 2017 (CN) .......................... 2017 1 0112960

(51) Int. Cl.
*G06K 9/00* (2006.01)
*H01L 27/32* (2006.01)
(52) U.S. Cl.
CPC ............ *G06K 9/0002* (2013.01); *H01L 27/32* (2013.01); *H01L 27/3234* (2013.01); *H01L 27/3276* (2013.01)

(58) Field of Classification Search
None
See application file for complete search history.

(56) References Cited

U.S. PATENT DOCUMENTS

| 7,126,350 B2 | 10/2006 | Miyasaka |
| 7,277,563 B2 | 10/2007 | Chou |

(Continued)

FOREIGN PATENT DOCUMENTS

| CN | 105264543 A | 1/2016 |
| CN | 105264545 A | 1/2016 |

(Continued)

OTHER PUBLICATIONS

Search Report for International Application No. PCT/CN2017/104729 dated Jan. 5, 2018.

*Primary Examiner* — Vikkram Bali
(74) *Attorney, Agent, or Firm* — Calfee, Halter & Griswold LLP

(57) ABSTRACT

There is disclosed a display panel and its driving method and a display device in the technical field of display. The display panel according to the disclosure includes a base substrate, a driving structure provided on the base substrate, a receiving structure provided above the driving structure, and a fingerprint detection module provided on the base substrate, wherein the driving structure is configured to create an ultrasonic signal, the receiving structure is configured to receive the ultrasonic signal reflected from a finger and transform the reflected ultrasonic signal into an electric signal which is input to the fingerprint detection module, and the fingerprint detection module is configured to determine fingerprint information from the electric signal output by the receiving structure.

16 Claims, 4 Drawing Sheets

(56) References Cited

U.S. PATENT DOCUMENTS

| | | | |
|---|---|---|---|
| 9,262,003 B2 | 2/2016 | Kitchens et al. | |
| 9,323,393 B2 | 4/2016 | Djordjev et al. | |
| 2004/0046574 A1 | 3/2004 | Chou | |
| 2005/0077911 A1 | 4/2005 | Miyasaka | |
| 2014/0055387 A1 | 2/2014 | Yeh | |
| 2014/0352440 A1 | 12/2014 | Fennell et al. | |
| 2014/0354596 A1 | 12/2014 | Djordjev et al. | |
| 2015/0123931 A1 | 5/2015 | Kitchens et al. | |
| 2015/0357375 A1* | 12/2015 | Tsai | H01L 41/31 257/416 |
| 2016/0117541 A1* | 4/2016 | Lu | G06K 9/0002 382/124 |
| 2017/0090024 A1* | 3/2017 | Kitchens, II | A61B 8/0858 |
| 2017/0323133 A1* | 11/2017 | Tsai | G06K 9/0002 |

FOREIGN PATENT DOCUMENTS

| | | |
|---|---|---|
| CN | 105393261 A | 3/2016 |
| CN | 105683883 A | 6/2016 |
| EP | 3005227 | 4/2016 |
| EP | 3005229 | 4/2016 |
| EP | 3005230 | 4/2016 |
| EP | 3066545 | 9/2016 |
| EP | 3005227 B1 | 4/2017 |
| IN | 201503045 P3 | 6/2016 |
| IN | 201506654 P4 | 7/2016 |
| IN | 201506666 P4 | 7/2016 |
| IN | 201627011765 A | 8/2016 |
| JP | 2005077104 A | 3/2005 |
| WO | 2014197274 A1 | 11/2014 |
| WO | 2014197333 A1 | 12/2014 |
| WO | 2014197504 A1 | 12/2014 |
| WO | 2015066599 A2 | 5/2015 |
| WO | 2015066599 A3 | 5/2015 |

\* cited by examiner

DISPLAY PANEL, DRIVING METHOD THEREFOR, AND DISPLAY DEVICE

CROSS REFERENCE

The present application is based upon International Application No. PCT/CN2017/104729, filed on Sep. 30, 2017, which claims the priority of Chinese Patent Application No. 201710112960.0, filed on Feb. 28, 2017, and the entire contents thereof are incorporated herein by reference as part of the present application.

TECHNICAL FIELD

The present disclosure relates to the technical field of display, in particular to a display panel, a driving method therefor, and a display device.

BACKGROUND

A fingerprint, which is an innate, unique, and distinguishable invariable characteristic for a human being, consists of a series of ridges and valleys on the epidermis of a fingertip. The details formed by the ridges and valleys usually include ridge bifurcations, ridge endings, plain arches, tented arches, left loops, right loops, whorls, or double loop whorls, which determine the uniqueness of the fingerprint patterns. The fingerprint recognition technology developed therefrom is a technique for verifying individual identities since early time. Depending on the different ways to collect and input fingerprints, what have been widely used and well-known now are optically imaging, thermo-sensitive sensors, infrared sensors of the human body and the like.

In the disclosure there will be proved a novel display device have a function of recognizing fingerprints.

It should be noted that, information disclosed in the above background portion is provided only for better understanding of the background of the present disclosure, and thus it may contain information that does not form the prior art known by those ordinary skilled in the art.

SUMMARY

The disclosure provides a display panel having a function of recognizing fingerprints and a driving method therefor, and a display device.

According to an aspect of the present disclosure, there is provided a display panel including a base substrate, a driving structure provided on the base substrate, a receiving structure provided over the driving structure, and a fingerprint detection module provided on the base substrate, wherein the driving structure is configured to create an ultrasonic signal, the receiving structure is configured to receive the ultrasonic signal reflected from a finger and transform the reflected ultrasonic signal into an electric signal which is input to the fingerprint detection module, and the fingerprint detection module is configured to determine fingerprint information from the electric signal output by the receiving structure.

Optionally, the driving structure includes a first electrode, a first piezoelectric material layer and a second electrode which are provided sequentially away from a side of the base substrate.

Optionally, the receiving structure includes a third electrode, a second piezoelectric material layer and a fourth electrode which are provided sequentially away from a side of the driving structure.

Further optionally, the third electrode includes a plurality of block electrodes, and the fourth electrode includes a plate electrode.

Further optionally, the display panel includes a plurality of pixel regions, and said block electrode is provided in at least a part of the pixel regions.

Optionally, the display panel further includes a plurality of detection signal lines, a plurality of reading signal lines, a plurality of data signal lines and a plurality of reset signal lines which are provided above the base substrate, and the finger detection module includes a rectifier diode, a first transistor, a second transistor, and a third transistor, wherein the rectifier diode has a first terminal connected with the receiving structure and a second terminal connected with a node A, the first transistor has a first terminal connected with its corresponding reading signal line, a second terminal connected with a first terminal of the second transistor, and a control terminal connected with its corresponding driving signal line, the second transistor has the first terminal thereof connected with the second terminal of the first transistor, a second terminal connected with the data signal line, and a control terminal connected with the node A, the third transistor has a first terminal connected with its corresponding reset signal line, a second terminal connected with the node A, and a control terminal connected with its corresponding driving signal line, the node A is a connection node of the second terminal of the third transistor, the second terminal of the rectifier diode and the control terminal of the second transistor, and the driving signal line connected with the first transistor and the driving signal line connected with the control terminal of the third transistor are two adjacent driving signal lines.

Further optionally, the display panel includes a plurality of pixel units, and the driving signal lines are multiplexed as gate lines during a displaying stage which are configured to provide gate driving signals for their corresponding pixel units.

According to an aspect of the present disclosure, there is provided a driving method for a display panel, the display panel being the aforesaid display panel, the driving method including:

in a fingerprint recognition stage, applying a driving voltage to the driving structure which creates an ultrasonic signal, the ultrasonic signal being reflected by a finger and received and transformed by the receiving structure into an electric signal which is input to the finger detection module, the finger detection module determining fingerprint information from the electric signal output by the receiving structure.

Optionally, the finger detection module determining fingerprint information from the electric signal output by the receiving structure includes:

in a reset stage, inputting an operation level to the Nth driving signal line, inputting a reset signal to the reset signal lines, turning on the third transistor, and transmitting the reset signal to the node A to make polarity of a level of the node A opposite to polarity of the operation level;

in a cumulating stage, the electric signal, into which the ultrasonic signal reflected from a finger is transformed by the receiving structure, raising the level of the node A via the rectifier diode; and in a reading stage, applying a signal of operation level to the (N+1)-th driving signal line, applying a data signal through the data signal lines, turning on the first transistor, and reading the signal input through the data signal lines by means of the reading signal lines to determine information of a touching fingerprint, wherein N is an integer larger than or equal to 1.

According to an aspect of the present disclosure, there is provided a display device including the aforesaid display panel.

According to an aspect of the present disclosure, there is provided a method for driving the aforesaid display device.

According to an aspect of the present disclosure, there is provided a display apparatus, including the above pixel compensation apparatus.

It is to be understood that both the foregoing general description and the following detailed description are exemplary and explanatory only and are not restrictive of the present disclosure.

DETAILED DESCRIPTION

In order to make those skilled in the art understand better the technical solution of the disclosure, a further detailed description will hereinafter be made thereto in conjunction with the accompanying drawings and embodiments.

Figure 1:
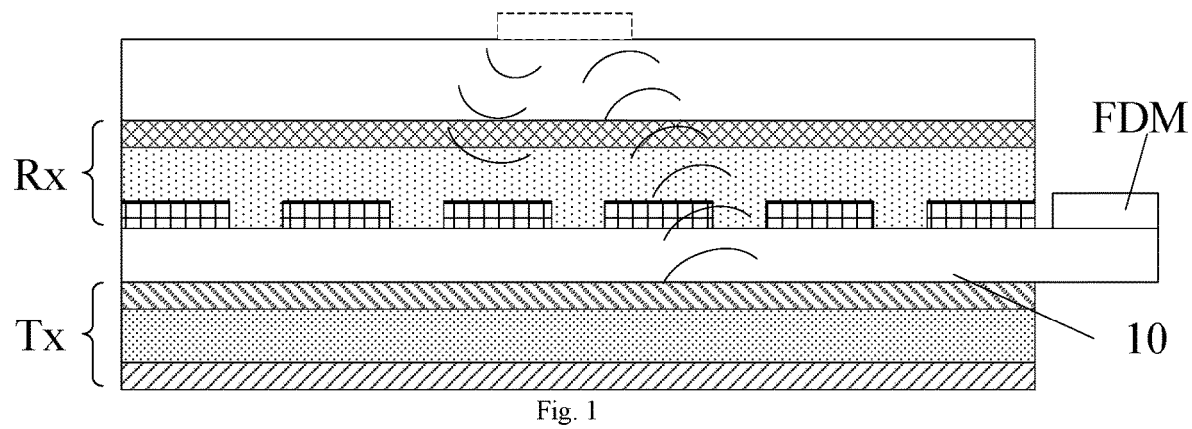
FIG. 1 is a schematic structural view of a display panel according to an embodiment of the disclosure.

As shown in FIG. 1, in the embodiment there is provided a display panel including a base substrate 10, a driving structure Tx provided on the base substrate 10, a receiving structure Rx provided over the driving structure Tx, and a fingerprint detection module FDM provided on the base substrate 10, wherein the driving structure Tx is configured to create an ultrasonic signal, the receiving structure Rx is configured to receive an ultrasonic signal reflected from a finger (in FIG. 1 the dotted frame indicates the position where the finger is pressed) and transform the reflected ultrasonic signal into an electric signal which is input to the fingerprint detection module, and the fingerprint detection module is configured to determine fingerprint information from the electric signal output by the receiving structure Rx.

Since the display panel according to the embodiment includes the driving structure Tx, the receiving structure Rx and the fingerprint detection structure, the driving structure Tx, when applied to with a driving voltage, creates an ultrasonic signal which is received by the receiving structure Rx after being reflected back by a finger and is transformed into an electric signal which is input to the fingerprint detection module. The fingerprint detection module determines fingerprint information from the electric signal output by the receiving structure Rx. That is to say, in the embodiment of the disclosure there is provided a display panel which uses an ultrasonic device to implement the function of fingerprint recognition.

Here, the driving structure Tx and the receiving structure Rx in the display panel may be positioned at the same side of the base substrate 10, or at different sides of the base substrate 10. In the embodiment, an example that the driving structure Tx and the receiving structure Rx are positioned at different sides of the base substrate 10 will be taken to explain a specific structure of the display panel according to the embodiment. However the present disclosure is not limited to this example.

Figure 2:
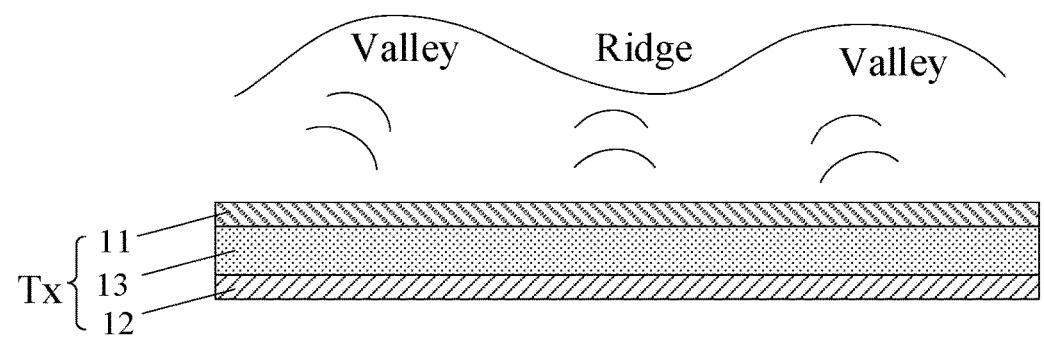
FIG. 2 is a schematic structural view of a driving structure of a display panel according to an embodiment of the disclosure.

In particular, as shown in FIG. 2, the driving structure Tx in the display panel includes a first electrode 11, a first layer of piezoelectric material 13 and a second electrode 12 which are provided sequentially away from a side of the base substrate 10, wherein the first piezoelectric material 13 between the first and second electrodes 11 and 12 will create an ultrasonic wave when a driving voltage is applied to the first and second electrodes 11 and 12. It should be noted that there may be an air chamber below the driving structure Tx to facilitate enhancement of the ultrasonic wave such that the ultrasonic wave can be better transmitted outside. Here, both the first and second electrodes 11 and 12 are optionally plate electrodes. Of course, electrodes of other structures may alternatively be used.

Figure 3:
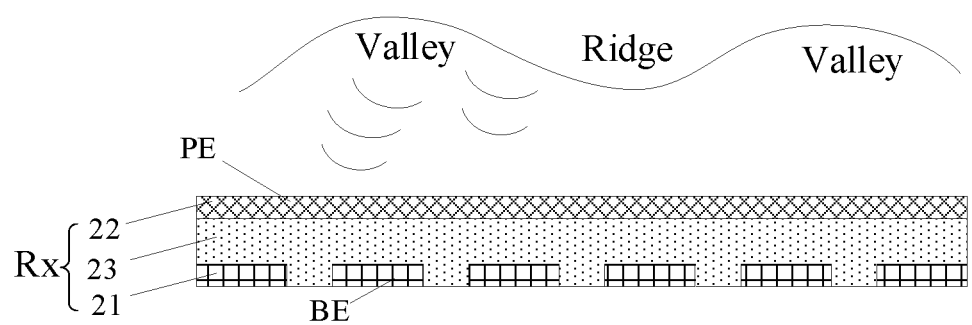
FIG. 3 is a schematic structural view of a receiving structure of a display panel according to an embodiment of the disclosure.

In particular, as shown in FIG. 3, the receiving structure Rx in the display panel includes a third electrode 21, a second layer of piezoelectric material 23 and a fourth electrode 22 which are provided sequentially away from a side of the driving structure Tx, wherein the third electrode 21 includes a plurality of block electrodes BE, and the fourth electrode 22 includes a plate electrode. The operation principle of the receiving structure Rx is as follows. When the fourth electrode 22 of the receiving structure Rx, connected with a fixed level, receives an ultrasonic wave reflected back from the finger, the second layer of piezoelectric material 23 transforms the ultrasonic signal into a driving voltage which is output to the fingerprint detection module by the third electrode 21. Since the reflected ultrasonic signals from the ridges and the valleys are different in amplitude, the amplitude of the driving voltage transformed into from the ultrasonic signal by the second layer of piezoelectric material 23 will be different, then the driving voltage signal output by the third electrode 21 is different accordingly. In such a case, the fingerprint detection module may determine from the driving voltage signal output by the third electrode 21 corresponding fingerprint information.

Figure 4:
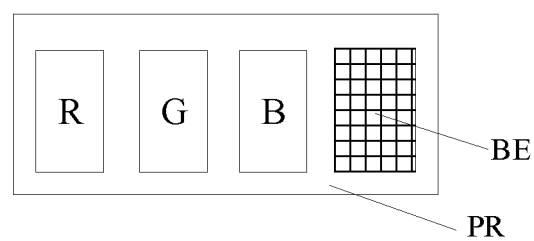
FIG. 4 is a schematic structural view of pixel region of a display panel according to an embodiment of the disclosure.

Optionally, as shown in FIG. 4, the display panel may be divided into a plurality of pixel regions PR, and said block electrode BE is provided in at least a part of the pixel regions, to enable more precise fingerprint recognition. Here, at the same time, each pixel region also includes a plurality of sub-pixels such as red sub-pixels R, green sub-pixels G and blue sub-pixels B.

Figure 5:
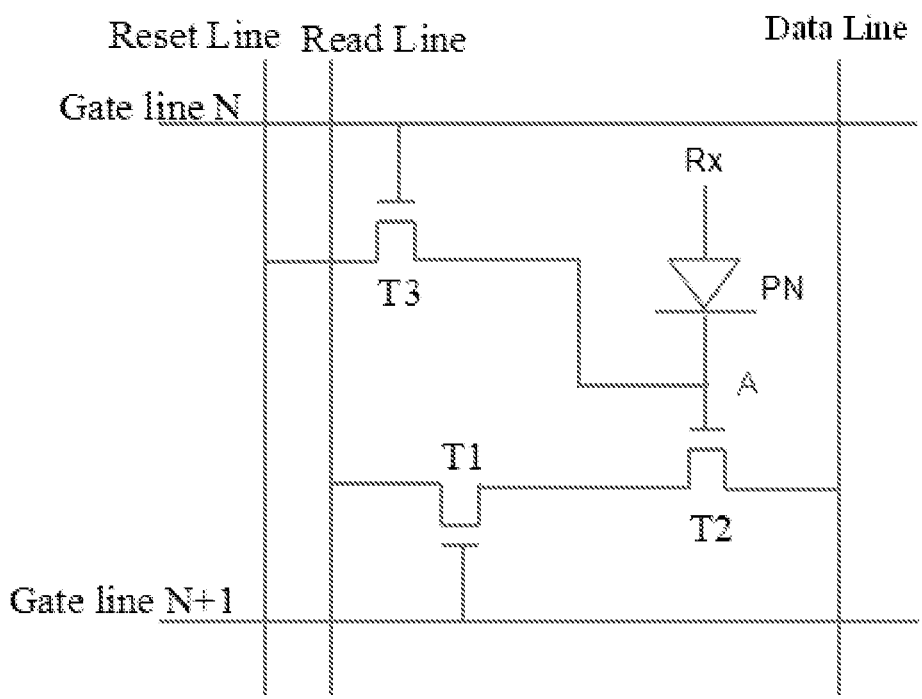
FIG. 5 is a circuit diagram of a finger detection module of a display panel according to an embodiment of the disclosure.

In particular, as shown in FIG. 5, the display panel may further include a plurality of detection signal lines, a plurality of reading signal lines Read Lines, a plurality of data signal lines Data Lines, and a plurality of reset signal lines Reset Lines provided above the base substrate 10. The fingerprint detection module of the display panel includes a rectifier diode PN, a first transistor T1, a second transistor T2, and a third transistor T3, wherein the rectifier diode has a first terminal connected with the receiving structure Rx and a second terminal connected with a node A; the first transistor T1 has a first terminal connected with its corresponding reading signal line Read Line, a second terminal connected with a first terminal of the second transistor T2, and a control terminal connected with its corresponding driving signal line Gate Line; the second transistor T2 has its first terminal connected with the second terminal of the first transistor, a second terminal connected with the data signal line Data Line, a control terminal connected with the node A; the third transistor T3 has a first terminal connected with its corresponding reset signal line Rest Line, a second terminal connected with the node A, a control terminal connected with its corresponding driving signal line Gate Line; the node A is a connection node of the second terminal of the third transistor T3, the second terminal of the rectifier diode PN and the control terminal of the second transistor T2; and the driving signal line Gate Line connected with the first transistor T1 and the driving signal line Gate Line connected with the control terminal of the third transistor T2 are two adjacent driving signal lines Gate Lines.

Hereinafter, a description will be made for the operation principle of a fingerprint module in which the control terminal of the third transistor T3 thereof is connected with the Nth driving signal line Gate Line, and the control terminal of the first transistor T1 thereof is connected with the (N+1)-th driving signal line Gate Line. All of the transistors T1, T2 and T3 are an N-type transistor. In other implementations, the transistors T1, T2 and T3 may alternatively be a P-type transistor or the like. Hereinafter, only the example that all of the transistors T1, T2 and T3 are an N-type transistor is taken for description.

In a first stage (a reset stage), the signal input to the Nth driving signal line Gate Line has a high level, the third transistor T3 is turned on, a reset signal input by the reset signal line Rest Line is transmitted through the third transistor T3 to the control terminal of the second transistor T2 and the first end of the rectified diode PN, i.e., the N end of the PN junction to initialize that electrode such that the level of the node A is in a low level and the second transistor T2 is turned off. Accordingly, in this stage, the reset signal is transmitted to the node A to make polarity of a level of the node A opposite to polarity of the operation level.

In a second state (a cumulating stage), the ultrasonic signal reflected back from the ridges or valleys of a finger is transformed into a corresponding electric signal after transmitting through the piezoelectric material in the receiving structure Rx, and the electrical signal will raise the level of the node A via the PN junction. During such a period of time, only if the reflected ultrasonic signal from the finger is larger than that at previous point of time, the level of the node A will rise continuously via the PN junction. At the present time, the level of the control terminal of the second transistor T2 has an increasing difference over time on account of the different ultrasonic waves in amplitude reflected from the ridges or valleys.

In a third state (a reading stage), a signal of low level is input to the Nth driving signal line Gate Line and a signal of high level is input to the (N+1)-th driving signal line, the third transistor T3 is turned off and the first transistor T1 is turned on, and a signal reading line is used to read the data input through the data signal line Data Line. If there is no operation on fingerprint, the control terminal of the second transistor T2 is kept at low level and the second transistor T2 is turned off, the signal at the reading signal line is maintained.

Here, the display panel optionally includes thereon a plurality of pixel units, and the driving signal lines Gate Lines are multiplexed as gate lines during a displaying stage of the display panel, and configured to provide gate driving signals for their corresponding pixel units. In particular, each of the pixel units includes a pixel driving circuit, for which the driving signal line Gate Line serves to provide a gate driving signal to control whether the pixel driving circuit operates or not.

In the embodiment there is provided a driving method for a display panel which is any of the display panels according to the embodiment. The driving method including:

in a fingerprint recognition stage, applying a driving voltage to the driving structure Tx which creates an ultrasonic signal, wherein the ultrasonic signal is reflected back by a finger and received and transformed by the receiving structure Rx into an electric signal which is input to the finger detection module, and the finger detection module determines fingerprint information from the electric signal output by the receiving structure Rx.

Of course, it should be understood that the driving method for the display panel may further include in a displaying stage, sequentially scanning the respective rows of pixel units on the display panel to enable the respective pixel units to display corresponding grey scales.

In particular, by taking it as an example that the driving structure Tx includes a first electrode 11, a first layer of piezoelectric material 13 and a second electrode 12 which are provided sequentially away from a side of the base substrate 10, the receiving structure Rx includes a third electrode 21, a second layer of piezoelectric material 23 and a fourth electrode 22 which are provided sequentially away from a side of the driving structure Tx, the fingerprint detection module includes a rectifier diode, a first transistor T1, a second transistor T2 and a third transistor T3, and the display panel further includes a plurality of detection signal lines, a plurality of reading signal lines Read Lines, a plurality of data signal lines Data Lines, and a plurality of reset signal lines Reset Lines above the base substrate 10, a description will be made for a specific operation of the display panel during the fingerprint recognition.

Figure 6:
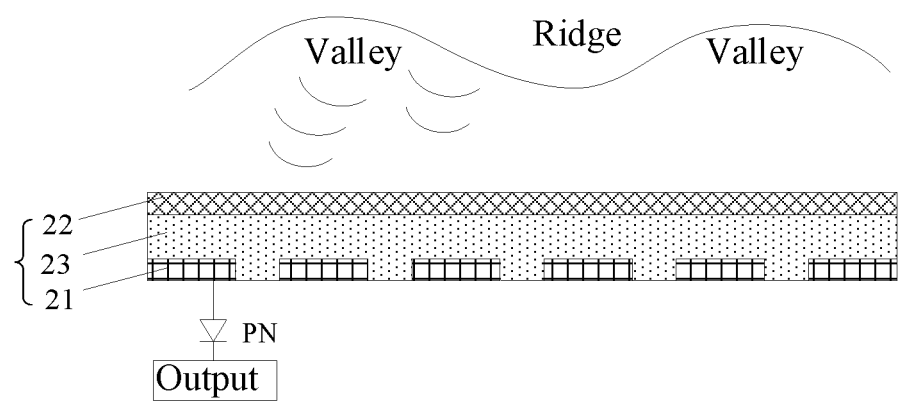
FIG. 6 is a schematic view of connection between a receiving structure and a rectifier diode of a display panel according to an embodiment of the disclosure.
Figure 7:
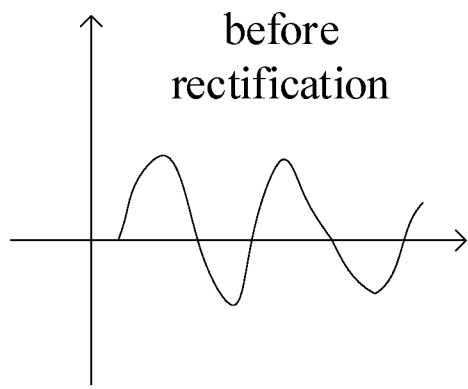
FIG. 7 is a schematic view of an electric signal output by a third electrode of the receiving structure as shown in FIG. 6.
Figure 8:
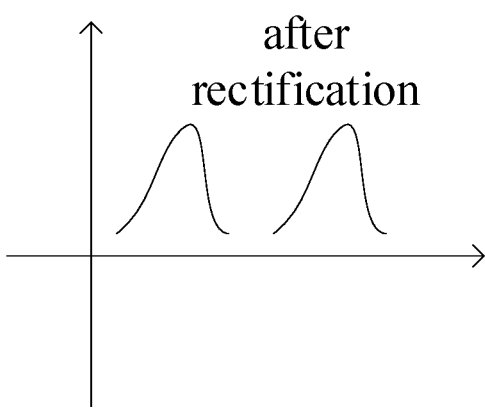
FIG. 8 is a schematic view of an electric signal output by the rectifier diode as shown in FIG. 6.

As shown in FIG. 6, a driving voltage is applied to the first and second electrodes 11 and 12, and the first layer of piezoelectric material 13 therebetween will creates an ultrasonic wave. When the fourth electrode 22 of the receiving structure Rx receives the ultrasonic wave reflected back from a finger, the second layer of piezoelectric material 23 will transform the ultrasonic signal into a driving voltage which is output to the rectifier diode (PN junction) of the fingerprint detection module via the third electrode 21. Since the rectifier diode has a unidirectional conductance, i.e., the rectifier diode amounts to a filter, the electrical signal (sinusoidal wave) output by the third electrode 21 as shown in FIG. 7 may be subject to a rectification process and transformed into a unidirectional signal as shown in FIG. 8. The fingerprint recognition operation of the fingerprint detection module is as follows.

In a first stage (a reset stage), the signal input to the Nth driving signal line Gate Line has a high level, the third transistor T3 is turned on, a reset signal input by the reset signal line Rest Line is transmitted through the third transistor T3 to the control terminal of the second transistor T2 and the first end of the rectified diode PN, i.e., the N end of the PN junction to initialize that electrode such that the level of the node A is in a low level and the second transistor T2 is turned off. Accordingly, in this stage, the reset signal is transmitted to the node A to make polarity of a level of the node A opposite to polarity of the operation level.

In a second state (a cumulating stage), the ultrasonic signal reflected back from the ridges or valleys of a finger is transformed into a corresponding electric signal after transmitting through the piezoelectric material in the receiving structure Rx, and the electrical signal will raise the level of the node A via the PN junction. During such a period of time, only if the reflected ultrasonic signal from the finger is larger than that at previous point of time, the level of the node A will rise continuously via the PN junction. At the present time, the level of the control terminal of the second transistor T2 has an increasing difference over time on account of the different ultrasonic waves in amplitude reflected from the ridges or valleys.

In a third state (a reading stage), a signal of low level is input to the Nth driving signal line Gate Line and a signal of high level is input to the (N+1)-th driving signal line, the third transistor T3 is turned off and the first transistor T1 is turned on, and a signal reading line is used to read the data input through the data signal line Data Line. If there is no operation on fingerprint, the control terminal of the second transistor T2 is kept at low level and the second transistor T2 is turned off, the signal at the reading signal line is maintained.

In the embodiment there is provided a display device including the display panel according to the embodiment. Accordingly, the display device according to the embodiment has the function of fingerprint recognition.

Here, the display device may be a liquid crystal display device or an electroluminescent display device, such as a liquid crystal panel, an electronic paper, an OLED panel, a mobile phone, a tablet computer, a TV, a displayer, a notebook computer, a digital photo frame, a navigator and any other product or component having display function.

The disclosure has advantages as follows.

Since the display panel according to the disclosure includes a driving structure, a receiving structure and a fingerprint detection structure, the driving structure when applied to with a driving voltage, creates an ultrasonic signal which is received by the receiving structure after being reflected back by a finger and is transformed into an electric signal which is input to the fingerprint detection module. The fingerprint detection module determines fingerprint information from the electric signal output by the receiving structure. That is to say, in the disclosure there is provided a display panel which uses an ultrasonic device to implement the function of fingerprint recognition.

It would be appreciated that the above embodiments are provided only as exemplary embodiments to illustrate the principle of the disclosure. The disclosure, however, is not limited thereto. Those skilled in the art will be able to make various modifications and improvements, without going beyond the spirit and essence of the disclosure, which should also be considered to be in the protection scope of the disclosure.

What is claimed is:

1. A display panel comprising a base substrate, a driving structure provided on the base substrate, a receiving structure provided over the driving structure, and a fingerprint detection module provided on the base substrate, wherein
the driving structure is configured to create an ultrasonic signal,
the receiving structure is configured to receive the ultrasonic signal reflected from a finger and to transform the reflected ultrasonic signal into an electric signal which is input to the fingerprint detection module, and
the fingerprint detection module is configured to determine fingerprint information from the electric signal output by the receiving structure,
wherein the display panel further comprises a plurality of detection signal lines, a plurality of reading signal lines, a plurality of data signals lines and a plurality of reset signal lines which are provided above the base substrate, and the finger detection module comprises a rectifier diode, a first transistor, a second transistor, and a third transistor, wherein
the rectifier diode has a first terminal connected with the receiving structure and a second terminal connected with a node A,
the first transistor has a first terminal connected with its corresponding reading signal line, a second terminal connected with a first terminal of the second transistor, and a control terminal connected with its corresponding driving signal line,
the second transistor has the first terminal thereof connected with the second terminal of the first transistor, a second terminal connected with the data signal line, and a control terminal connected with the node A,
the third transistor has a first terminal connected with its corresponding reset signal line, a second terminal connected with the node A, and a control terminal connected with its corresponding driving signal line,
the node A is a connection node of the second terminal of the third transistor, the second terminal of the rectifier diode and the control terminal of the second transistor, and
the driving signal line connected with the first transistor and the driving signal line connected with the control terminal of the third transistor are two adjacent driving signal lines.

2. The display panel according to claim 1, wherein the driving structure comprises a first electrode, a first piezoelectric material layer and a second electrode which are provided sequentially away from a side of the base substrate.

3. The display panel according to claim 1, wherein the receiving structure comprises a third electrode, a second piezoelectric material layer and a fourth electrode which are provided sequentially away from a side of the driving structure.

4. The display panel according to claim 3, wherein the third electrode comprises a plurality of block electrodes, and the fourth electrode comprises a plate electrode.

5. The display panel according to claim 4, wherein the display panel comprises a plurality of pixel regions, and said block electrode is provided in at least a part of the pixel regions.

6. The display panel according to claim 1, further comprising a plurality of pixel units, and the driving signal lines are multiplexed as gate lines during a displaying stage which are configured to provide gate driving signals for their corresponding pixel units.

7. A driving method for a display panel, the display panel being the display panel according to claim 1, the driving method comprising:
in a fingerprint recognition stage, applying a driving voltage to the driving structure which creates an ultrasonic signal, the ultrasonic signal being reflected by a finger and received and transformed by the receiving structure into an electric signal which is input to the finger detection module, the finger detection module determining fingerprint information from the electric signal output by the receiving structure.

8. The driving method for a display panel according to claim 7, wherein the step of the finger detection module determining fingerprint information from the electric signal output by the receiving structure comprises:

in a reset stage, inputting an operation level to the Nth driving signal line, inputting a reset signal to the reset signal lines, turning on the third transistor, and transmitting the reset signal to the node A to make polarity of a level of the node A opposite to polarity of the operation level;

in a cumulating stage, the electric signal, into which the ultrasonic signal reflected from a finger is transformed by the receiving structure, raising the level of the node A via the rectifier diode; and in a reading stage, applying a signal of operation level to the (N+1)-th driving signal line, applying a data signal through the data signal lines, turning on the first transistor, and reading the signal input through the data signal lines by means of the reading signal lines to determine information of a touching fingerprint, wherein N is an integer larger than or equal to 1.

9. A display device comprising a display panel comprising a base substrate, a driving structure provided on the base substrate, a receiving structure provided above the driving structure, and a fingerprint detection module provided on the base substrate, wherein the driving structure is configured to create an ultrasonic signal, the receiving structure is configured to receive the ultrasonic signal reflected from a finger and to transform the reflected ultrasonic signal into an electric signal which is input to the fingerprint detection module, and the fingerprint detection module is configured to determine fingerprint information from the electric signal output by the receiving structure, wherein the display panel further comprises a plurality of detection signal lines, a plurality of reading signal lines, a plurality of data signals lines and a plurality of reset signal lines which are provided above the base substrate, and the finger detection module comprises a rectifier diode, a first transistor, a second transistor, and a third transistor, wherein the rectifier diode has a first terminal connected with the receiving structure and a second terminal connected with a node A, the first transistor has a first terminal connected with its corresponding reading signal line, a second terminal connected with a first terminal of the second transistor, and a control terminal connected with its corresponding driving signal line, the second transistor has the first terminal thereof connected with the second terminal of the first transistor, a second terminal connected with the data signal line, and a control terminal connected with the node A, the third transistor has a first terminal connected with its corresponding reset signal line, a second terminal connected with the node A, and a control terminal connected with its corresponding driving signal line, the node A is a connection node of the second terminal of the third transistor, the second terminal of the rectifier diode and the control terminal of the second transistor, and the driving signal line connected with the first transistor and the driving signal line connected with the control terminal of the third transistor are two adjacent driving signal lines.

10. The display device according to claim 9, wherein the driving structure comprises a first electrode, a first piezoelectric material layer and a second electrode which are provided sequentially away from a side of the base substrate.

11. The display device according to claim 9, wherein the receiving structure comprises a third electrode, a second piezoelectric material layer and a fourth electrode which are provided sequentially away from a side of the driving structure.

12. The display device according to claim 11, wherein the third electrode comprises a plurality of block electrodes, and the fourth electrode comprises a plate electrode.

13. The display device according to claim 12, wherein the display panel comprises a plurality of pixel regions, and said block electrode is provided in at least a part of the pixel regions.

14. The display device according to claim 9, wherein the display panel comprises a plurality of pixel units, and the driving signal lines are multiplexed as gate lines during a displaying stage which are configured to provide gate driving signals for their corresponding pixel units.

15. A method for driving the display device according to claim 9, comprising:

in a fingerprint recognition stage, applying a driving voltage to the driving structure which creates an ultrasonic signal, the ultrasonic signal being reflected by a finger and received and transformed by the receiving structure into an electric signal which is input to the finger detection module, the finger detection module determining fingerprint information from the electric signal output by the receiving structure.

16. The method for driving the display device according to claim 15, wherein the step of the finger detection module determining fingerprint information from the electric signal output by the receiving structure comprises:

in a reset stage, inputting an operation level to the Nth driving signal line, inputting a reset signal to the reset signal lines, turning on the third transistor, and transmitting the reset signal to the node A to make polarity of a level of the node A opposite to polarity of the operation level;

in a cumulating stage, the electric signal, into which the ultrasonic signal reflected from a finger is transformed by the receiving structure, raising the level of the node A via the rectifier diode; and in a reading stage, applying a signal of operation level to the (N+1)-th driving signal line, applying a data signal through the data signal lines, turning on the first transistor, and reading the signal input through the data signal lines by means of the reading signal lines to determine information of a touching fingerprint, wherein N is an integer larger than or equal to 1.

* * * * *